United States Patent [19]
Lee

[11] Patent Number: 5,921,773
[45] Date of Patent: Jul. 13, 1999

[54] WAFER BOAT FOR A VERTICAL FURNACE

[75] Inventor: Yong-woon Lee, Kyungki-do, Rep. of Korea

[73] Assignee: Samsung Electonics Co., Ltd., Suwon, Rep. of Korea

[21] Appl. No.: 08/804,432

[22] Filed: Feb. 21, 1997

[30] Foreign Application Priority Data

Feb. 22, 1996 [KR] Rep. of Korea .......................... 96-4199

[51] Int. Cl.⁶ ....................................................... F27D 5/00
[52] U.S. Cl. ............................................ 432/258; 432/253
[58] Field of Search .................................... 432/253, 258, 432/241, 5, 6, 261; 99/483

*Primary Examiner*—John A. Jeffery
*Assistant Examiner*—Jiping Lu
*Attorney, Agent, or Firm*—Jones, Volentine, Steinberg & Whitt, L.L.P.

[57] ABSTRACT

An improved wafer boat for a vertical furnace has inner upper and lower corners formed as sloped surfaces, and has outer upper and lower corners formed as sloped surfaces. This prevents the formation and collection of particles off of the wafer boat that can generate a protrusion on the wafer boat. By preventing the formation of a protrusion, this improved wafer boat prevents damage to the wafers processed in the wafer boat and improves the reliability of semiconductor devices formed from those wafers. Also, holes are provided for locking pins on both the upper and lower plates of the wafer boat. This means that the wafer boat can be loaded into the furnace in both a rightside-up and upside-down orientation, thus increasing the lifespan of the boat and reducing boat maintenance costs.

8 Claims, 3 Drawing Sheets

WAFER BOAT FOR A VERTICAL FURNACE

BACKGROUND OF THE INVENTION

The present invention relates to a boat for loading semiconductor wafers. More particularly, the present invention relate to a wafer boat for a vertical furnace, which is used in a semiconductor manufacturing process.

Semiconductor chips must undergo numerous processes for integrated circuits (ICs) to be formed on them. Some of these processes are thermal treatment processes involving the use of a boat loaded with wafers that is inserted into a furnace. The furnaces used in these processes can be categorized as horizontal or vertical furnaces depending upon the orientation of the wafer boat. A horizontal furnace has the wafer boat introduced horizontally into the furnace, while a vertical furnace has the wafer boat introduced vertically.

FIGS. 1 and 2 are a perspective view and a sectional view, respectively, of a conventional wafer boat 11 for use in a vertical furnace. The boat is made of quartz and has a plurality of slots 13 formed on its inside. These slots 13 are evenly spaced between the lower and upper plates 31 and 33, which are installed on either end of the wafer boat 11. The slots 13 are evenly spaced to make them most efficient for loading wafers. Holes 35 are formed on the lower plate 31. These holes 35 allow the wafer boat 11 to be fixed to the furnace by pins (not shown) inserted into the holes 35 when the wafer boat 11 is inserted into the furnace. Inside each slot 13, an upper corner 25 is provided with a sloped surface, while a lower corner 27 has a right angle.

According to the above conventional wafer boat 11, particles off of the wafer boat 11 tend to collect on the lower corners of the slots 13, forming a protrusion that can cause damage to the loaded wafers. This damage in turn can cause a deterioration of the reliability of semiconductor devices formed on the wafers. In addition, after the wafer boat 11 has been locked into the furnace several times, the holes 35 can become worn and enlarged, thus reducing the useful life of the wafer boat 11.

SUMMARY OF THE INVENTION

It is an object of the present invention to provide a wafer boat for a vertical furnace that will not collect particles on a lower corner of its slots, and will thus avoid the generation of a protrusion on the wafer boat.

It is an another object of the present invention to provide a wafer boat for a vertical furnace that is usable even when it is loaded into the furnace upside-down.

To accomplish the above objectives there is provided a wafer boat for a vertical furnace, comprising: an upper plate provided on one end of the wafer boat, having a first fastening mechanism for locking the wafer boat to the furnace; a lower plate provided another end of the wafer boat, having a second fastening mechanism for locking the wafer boat to the furnace; and a plurality of slots formed between the upper and lower plates for holding a plurality of semiconductor wafers.

Preferably the upper and lower inner corners of the plurality of slots each have sloped surfaces and the upper and lower external corners of the plurality of slots each have sloped surface.

The first and second fastening mechanisms preferably each comprise one or more holes that are fastened to the furnace by one or more pins.

Accordingly, the present invention prevents the generation of protrusions on the inner lower corner, the outer upper corner, and the outer lower corner of the slots. This in turn improves the reliability of the semiconductor devices formed on the wafers processed in the wafer boat. Also, since the wafer boat is usable when placed either rightside-up or upside-down in the furnace, the usable life of the boat can be extended, thus reducing wafer boat maintenance costs.

BRIEF DESCRIPTION OF THE DRAWINGS

The above objects and advantages of the present invention will become more apparent by describing in detail a preferred embodiment of the invention with reference to the attached drawings.

DETAILED DESCRIPTION OF THE PREFERRED EMBODIMENTS OF THE INVENTION

Figure 1:
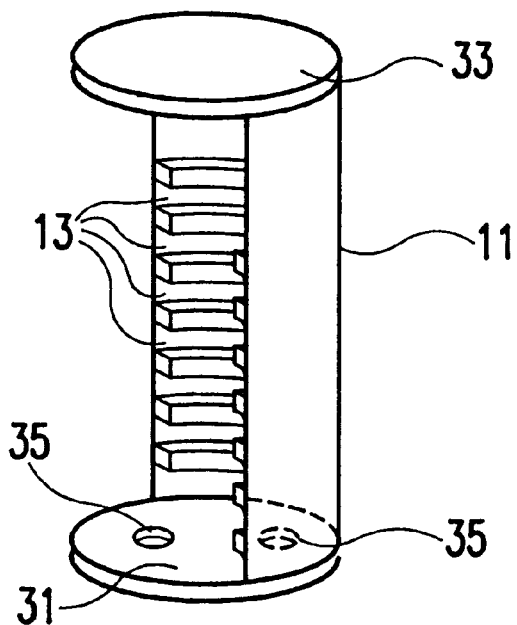
FIG. 1 is a perspective view showing a conventional boat for loading wafers in a vertical furnace.
Figure 2:
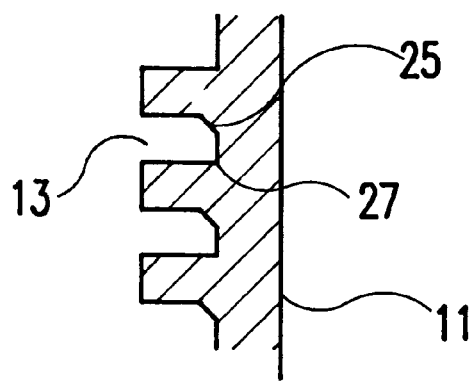
FIG. 2 is a sectional view showing part of the boat of FIG. 1.
Figure 3:
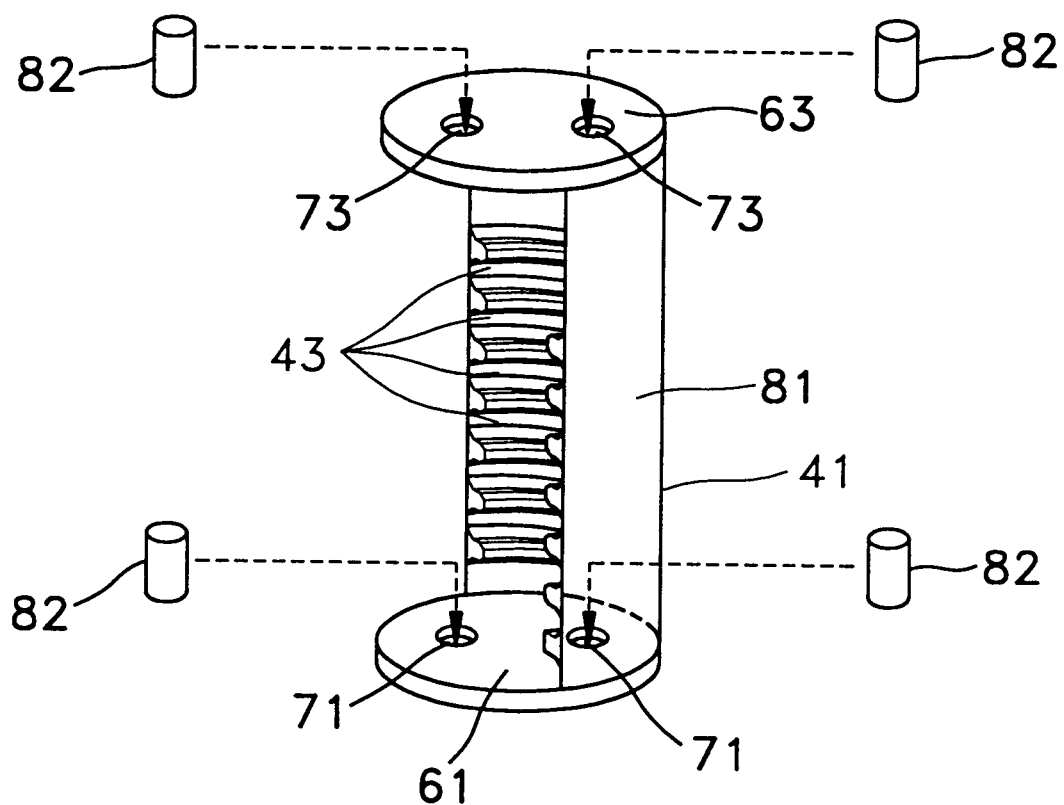
FIG. 3 is a perspective view showing a boat for loading wafers in a vertical furnace according to preferred embodiments of the present invention.

FIG. 3 shows a preferred embodiment of a wafer boat for loading wafers in a vertical furnace. As shown in FIG. 3, a wafer boat 41 has a lower plate 61, and upper plate 63, and a vertical support member 81 that has a plurality of slots 43 for holding wafers (not shown). Holes 71 and 73 are formed respectively on lower an upper plates 61 and 63. These plates 61 and 63 are installed respectively on the upper and lower ends of the wafer boat 41. Preferably the wafer boat is made of quartz.

When the wafer boat 41 is loaded into the a vertical furnace, it is locked into place by connecting pins 82 that are put in the holes 71 and 73 formed on one end of the wafer boat 41. Because the holes 71 and 73 are provided on both the lower and upper plates 61 and 63, the wafer boat 41 may be loaded—and used—in the furnace regardless of its orientation. In other words, when the wafer boat 41 is loaded rightside-up, it is locked to the furnace via the holes 71 formed in the lower plate 61; when the wafer boat 41 is loaded upside-down, it is locked to the furnace via the holes 73 formed in the upper plate 63. In this latter case, the upper plate 63 is actually placed in a downward position.

Figure 4:
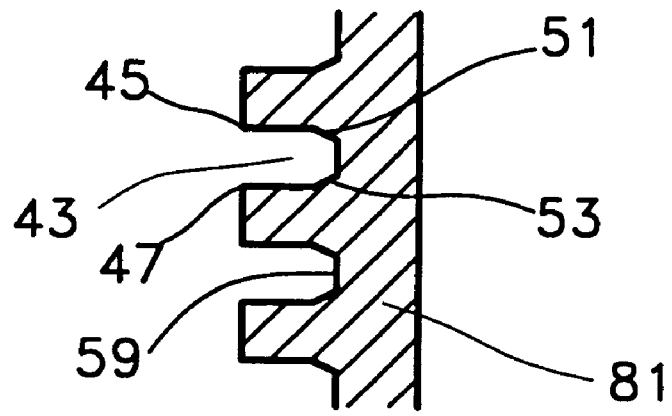
FIG. 4 is a sectional view showing part of the boat of FIG. 3, according to a first preferred embodiment of the present invention.

FIG. 4 is a sectional view showing a partial internal cross-section of the wafer boat 41 of FIG. 3 according to a first preferred embodiment of the present invention. As shown in FIG. 4, upper and lower internal corners 51 and 53 of each of the plurality of slots 43 are both formed as sloped surfaces that converge toward the back wall 59 of the slot 43 that is, each corner 51, 53 is formed of a protrusion-preventing sloped surface extending at an inclination from a horizontal support surface to the back wall 59. Therefore, the sloped surface of the lower corner 53 prevents the generation of a protrusion resulting from the collection of particles off of the loaded wafer when the wafer boat 41 is placed in the furnace rightside-up, i.e., with the lower plate 61 downwards. The sloped surface of the upper corner 51 prevents the generation of a protrusion resulting from the collection of particles off of the loaded wafer when the wafer boat 41 is placed in the furnace upside-down, i.e., with the upper plate 61 downwards. Because the design of the slots 43 prevents a protrusion from forming regardless of the orientation of the wafer boat 41, the wafer boat 41 can be effectively used whether it is placed in the furnace rightside-up or upside-down.

Figure 5:
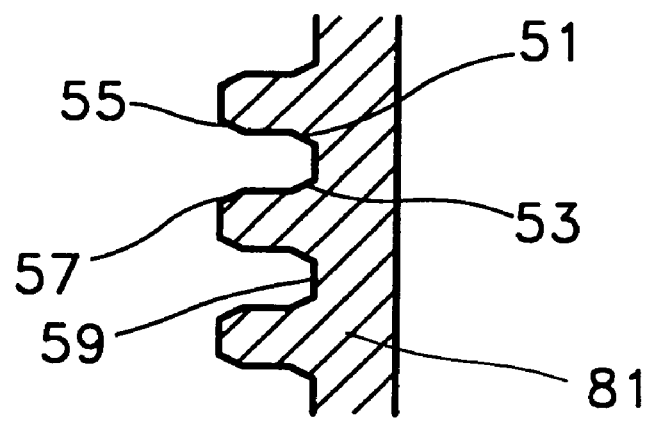
FIG. 5 is a sectional view showing part of the boat of FIG. 3, according to a second preferred embodiment of the present invention.

FIG. 5 is a sectional view showing a partial internal cross-section of the wafer boat 41 of FIG. 3 according to a second preferred embodiment of the present invention. The section of the wafer boat 41 in FIG. 5 is similar to the section shown in FIG. 4 with respect to the upper and lower corners of the plurality of slots 43. The second preferred embodiment includes sloped upper and lower corners 53 and 51 for the same reasons given above with reference to FIG. 4. However, the section shown in FIG. 5 also discloses sloped outer corners 55 and 57 at the entrances to each of the plurality of slots 43.

The sloped outer corners 55 and 57 minimize collisions with the wafers as they are inserted into and removed from the plurality of slots 43, which reduces the generation of quartz powder that would result from collisions with pointed corners. By reducing the amount of quartz powder formed, this design acts to further prevent the generation of a protrusion formed by a collection of quartz powder.

As described above, a wafer boat according to the present invention has a plurality of wafer-holding slots having sloped inner and outer corners. These sloped corners help prevent the generation of a protrusion formed from a collection of particles off of the boat. By preventing the generation of a protrusion on the wafer boat, this invention also prevents wafer damage caused by the protrusion and enhances the reliability of the semiconductor devices formed from those wafers.

In addition, since the wafer boat is usable when oriented in the vertical furnace both rightside-up and upside-down, the lifespan of the wafer boat is increased. This has the additional advantage of reducing boat maintenance costs.

What is claimed is:

1. An invertible wafer boat for a vertical furnace, comprising:

a first horizontal plate provided on one end of the wafer boat, having a first fastening mechanism for use in locking the wafer boat to the furnace in a first orientation in which said first horizontal plate constitutes the bottom of said boat;

a second horizontal plate provided on another end of the wafer boat, having a second fastening mechanism for use in locking the wafer boat to the furnace in a second orientation in which said second horizontal plate constitutes the bottom of said boat; and a vertical support member disposed between the first and second horizontal plates, the vertical support member having a plurality of slots for holding a plurality of semiconductor wafers, respectively each of said slots being defined by first and second opposing horizontal support surfaces extending parallel to said horizontal plates, a back wall constituting the bottom of the slot, a first protrusion-preventing surface extending from said first support surface to said back wall at an inclination relative to the first support surface, and a second protrusion-preventing surface extending from said second support surface to said back wall at an inclination relative to said second support surface, said first and second protrusion-preventing surfaces converging toward each other in a direction toward the back wall, whereby said first support surface will support a peripheral portion of a wafer when the wafer boat is in said first orientation, said second support surface will support a peripheral portion of a wafer when the wafer boat is in said second orientation, said first protrusion-preventing surface prevents the formation of a protrusion of particles between the first support surface and the back wall when the boat is in said first orientation, and said second protrusion-preventing surface prevents the formation of a protrusion of particles between the second support surface and the back wall when the boat is in said second orientation.

2. An invertible wafer boat for a vertical furnace, as recited in claim 1, wherein each of said slots is also defined by upper and lower external corners comprising sloped surfaces of the vertical member which converge in a direction toward said back wall and adjoin said horizontal support surfaces, respectively, at the top of the slot.

3. An invertible wafer boat for a vertical furnace, as recited in claim 1, wherein the first and second fastening mechanisms each comprise one or more holes through which one or more connecting pins are inserted to fasten the wafer boat to the furnace.

4. An invertible wafer boat for a vertical furnace, as recited in claim 1, wherein the wafer boat comprises quartz.

5. An invertible wafer boat for a vertical furnace, comprising:

a first horizontal plate provided on one end of the wafer boat;

first fastening means for locking the wafer boat to the furnace in a first orientation in which said first horizontal plate constitutes the bottom of said boat;

a second horizontal plate provided on another end of the wafer boat;

second fastening means for locking the wafer boat to the furnace in a second orientation in which said second horizontal plate constitutes the bottom of said boat; and a vertical support member disposed between the first and second horizontal plates, the vertical support member having a plurality of slots for holding a plurality of semiconductor wafers, respectively, each of said slots being defined by first and second opposing horizontal support surfaces extending parallel to said horizontal plates, a back wall constituting the bottom of the slot, a first protrusion-preventing surface extending from said first support surface to said back wall at an inclination relative to the first support surface, and a second protrusion-preventing surface extending from said second support surface to said back wall at an inclination relative to said second support surface, said first and second protrusion-preventing surfaces converging toward each other in a direction toward the back wall, whereby said first support surface will support a peripheral portion of a wafer when the wafer boat is in said first orientation, said second support surface will support a peripheral portion of a wafer when the wafer boat is in said second orientation, said first protrusion-preventing surface prevents the formation of a protrusion of particles between the first support surface and the back wall when the boat is in said first orientation and said second protrusion-preventing surface prevents the formation of a protrusion of particles between the second support surface and the back wall when the boat is in said second orientation.

6. An invertible wafer boat for a vertical furnace, as recited in claim 5, wherein each of said slots is also defined by upper and lower external corners comprising sloped surfaces of the vertical member which converge in a direction toward said back wall and adjoin said support surfaces, respectively, at the top of the slot.

7. An invertible wafer boat for a vertical furnace, as recited in claim 5, wherein the first and second fastening means each comprise one or more holes and connecting pins insertable through said holes, respectively, to fasten the wafer boat to the furnace.

8. An invertible wafer boat for a vertical furnace, as recited in claim 5, wherein the wafer boat comprises quartz.

\* \* \* \* \*